United States Patent
Shimura

(10) Patent No.: US 11,128,334 B2
(45) Date of Patent: Sep. 21, 2021

(54) BEAM FORMING DEVICE AND BEAM FORMING METHOD

(71) Applicant: FUJITSU LIMITED, Kawasaki (JP)

(72) Inventor: Toshihiro Shimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/896,749

(22) Filed: Jun. 9, 2020

(65) Prior Publication Data

US 2021/0013916 A1 Jan. 14, 2021

(30) Foreign Application Priority Data

Jul. 11, 2019 (JP) .............................. JP2019-129568

(51) Int. Cl.
| | | |
|---|---|---|
| *H04B 7/02* | (2018.01) | |
| *H04B 1/30* | (2006.01) | |
| *H01Q 3/26* | (2006.01) | |
| *H03D 7/16* | (2006.01) | |
| *H04B 7/0408* | (2017.01) | |
| *H04B 7/0426* | (2017.01) | |

(52) U.S. Cl.
CPC ............ *H04B 1/30* (2013.01); *H01Q 3/2605* (2013.01); *H03D 7/166* (2013.01); *H04B 7/043* (2013.01); *H04B 7/0408* (2013.01); *H04B 2001/307* (2013.01)

(58) Field of Classification Search
CPC ........ H04B 1/30; H04B 7/0408; H04B 7/043; H04B 2001/307; H04B 1/40; H04B 7/086; H04B 7/0617; H01Q 3/2605; H03D 7/166
USPC .................................................. 375/262, 267
See application file for complete search history.

(56) References Cited

U.S. PATENT DOCUMENTS

| | | | |
|---|---|---|---|
| 9,960,883 B1 | 5/2018 | Chakraborty | |
| 2013/0093624 A1 | 4/2013 | Raczkowski et al. | |
| 2013/0223251 A1* | 8/2013 | Li | H04B 7/0619 370/252 |
| 2014/0341261 A1* | 11/2014 | Weiler | H04B 1/44 375/219 |
| 2014/0347222 A1* | 11/2014 | Ling | H04B 1/40 342/373 |
| 2016/0087706 A1* | 3/2016 | Guey | H04L 5/005 375/267 |

(Continued)

FOREIGN PATENT DOCUMENTS

| | | |
|---|---|---|
| JP | 2017-212574 A | 11/2017 |
| JP | 2017-220801 A | 12/2017 |

(Continued)

OTHER PUBLICATIONS

Extended European Search Report from the European Patent Office in counterpart European Application No. 20178920.3, dated Nov. 17, 2020.

*Primary Examiner* — Don N Vo
(74) *Attorney, Agent, or Firm* — Arent Fox LLP

(57) ABSTRACT

A beam forming device includes a plurality of control circuits and a plurality of antenna elements. Each of the plurality of control circuits controls at least either phases or amplitudes of a plurality of input signals to generate a transmission signal. Each of the plurality of antenna elements outputs the transmission signal generated by a corresponding control circuit. A frequency range of the transmission signal generated by each of the control circuits is higher than frequency ranges of the input signals.

20 Claims, 13 Drawing Sheets

(56) References Cited

U.S. PATENT DOCUMENTS

| | | | |
|---|---|---|---|
| 2017/0288762 A1* | 10/2017 | Miyanaga | H01Q 3/267 |
| 2017/0346184 A1 | 11/2017 | Nishikawa et al. | |
| 2018/0287678 A1 | 10/2018 | Kihira et al. | |
| 2019/0028153 A1 | 1/2019 | Suyama et al. | |
| 2019/0356373 A1 | 11/2019 | Takeda et al. | |
| 2020/0028556 A1 | 1/2020 | Inoue et al. | |

FOREIGN PATENT DOCUMENTS

| | | |
|---|---|---|
| JP | 2018-148409 A | 9/2018 |
| WO | WO-2016/082887 A1 | 6/2016 |
| WO | WO-2016/166851 A1 | 10/2016 |
| WO | WO-2017/135389 A1 | 8/2017 |
| WO | WO-2018/024333 A1 | 2/2018 |
| WO | WO-2018/143392 A1 | 8/2018 |

* cited by examiner

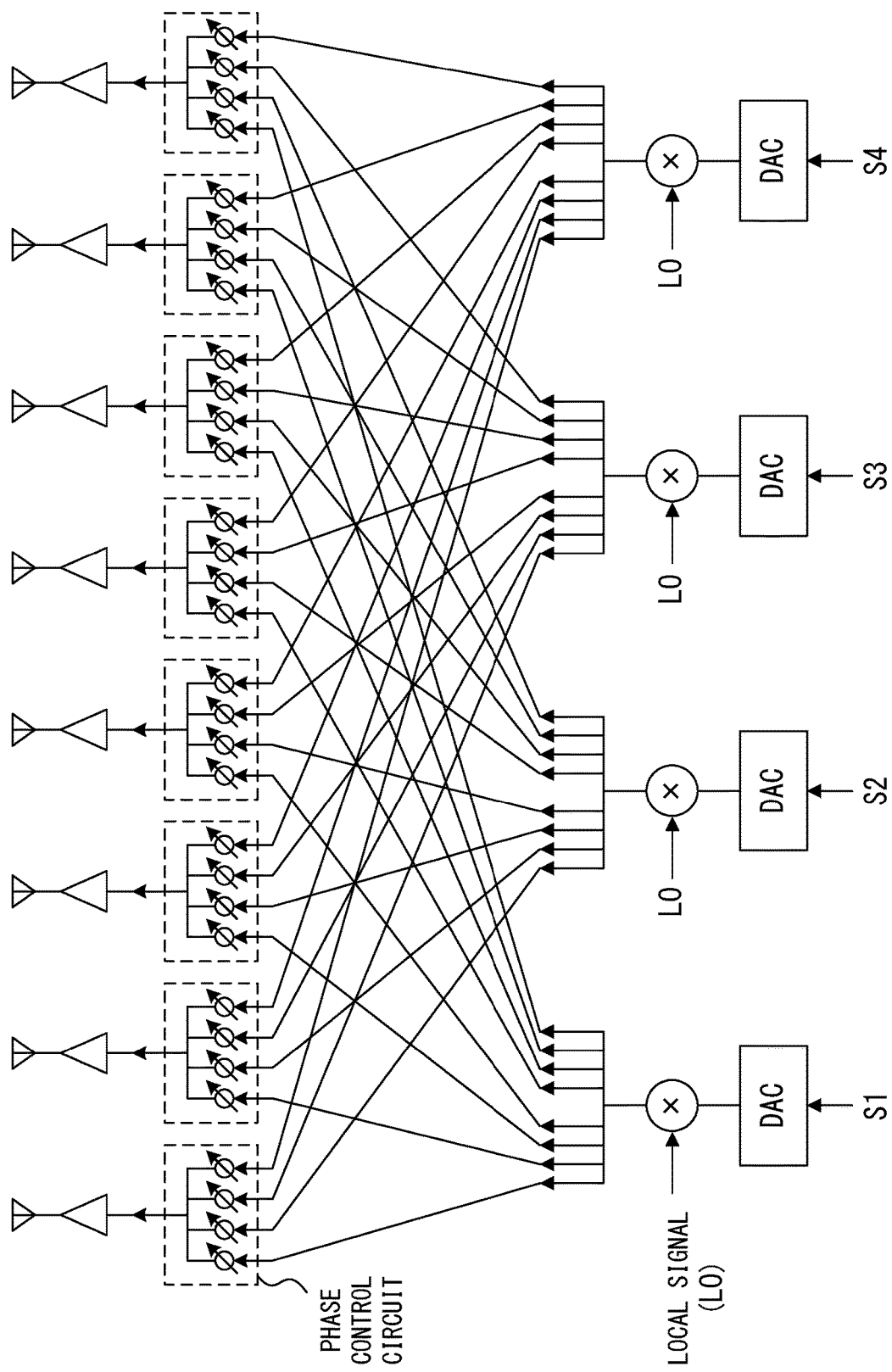
F I G. 1

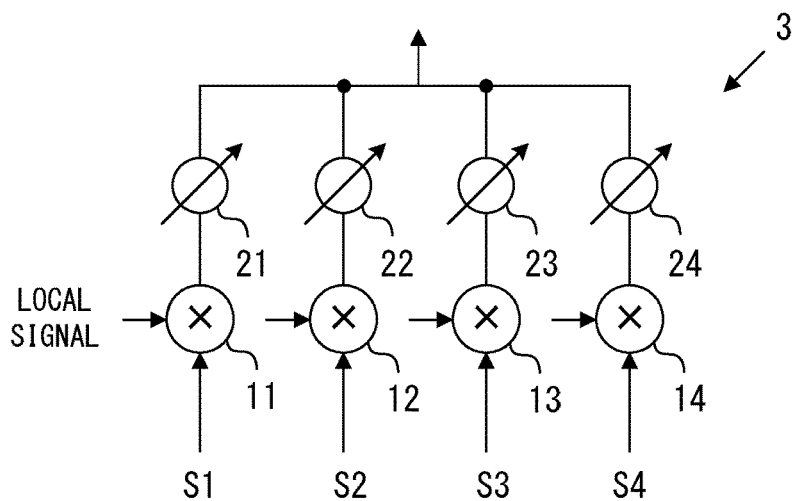
F I G. 4 A
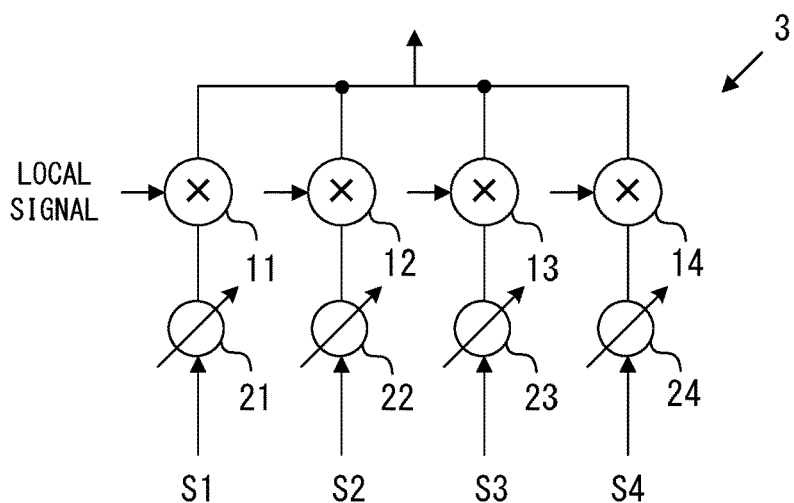
F I G. 4 B
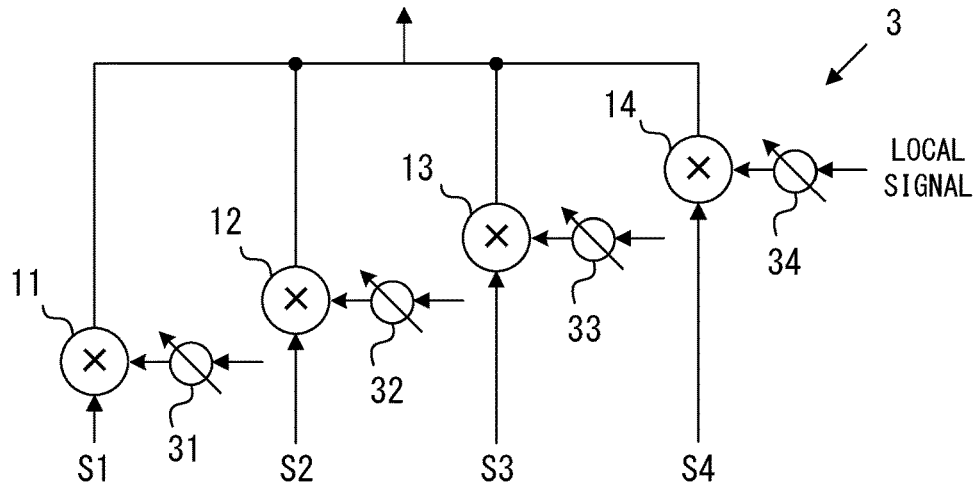
F I G. 4 C

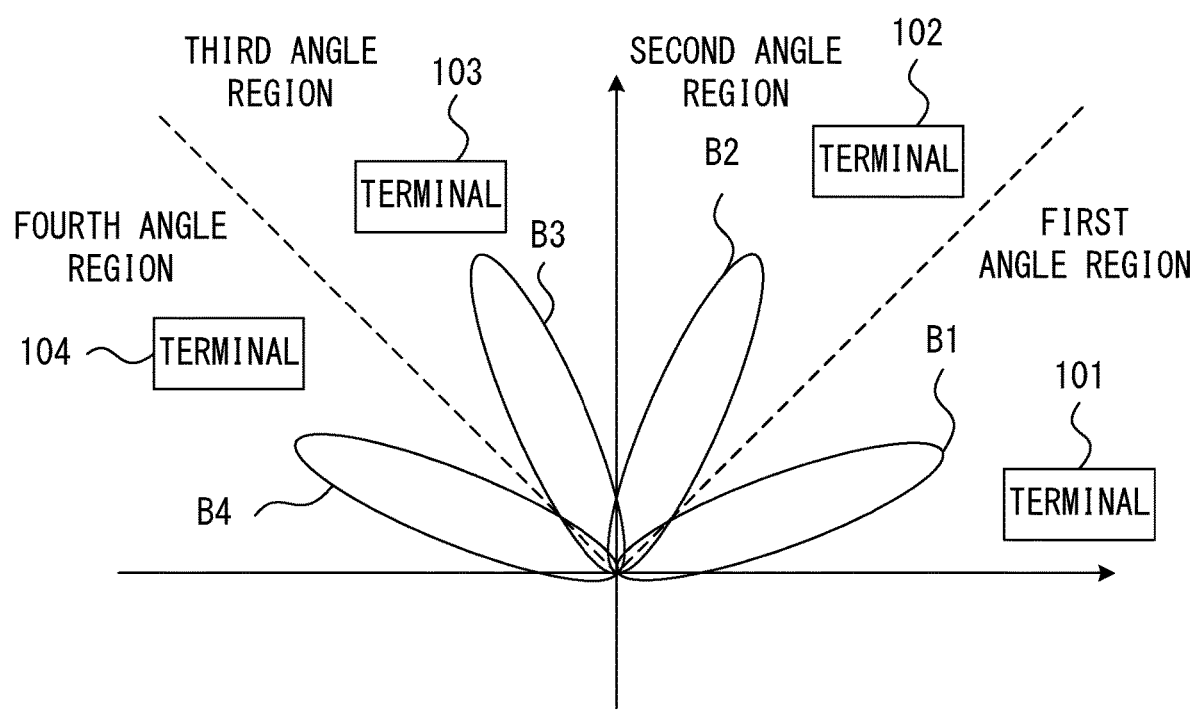
F I G. 6 A
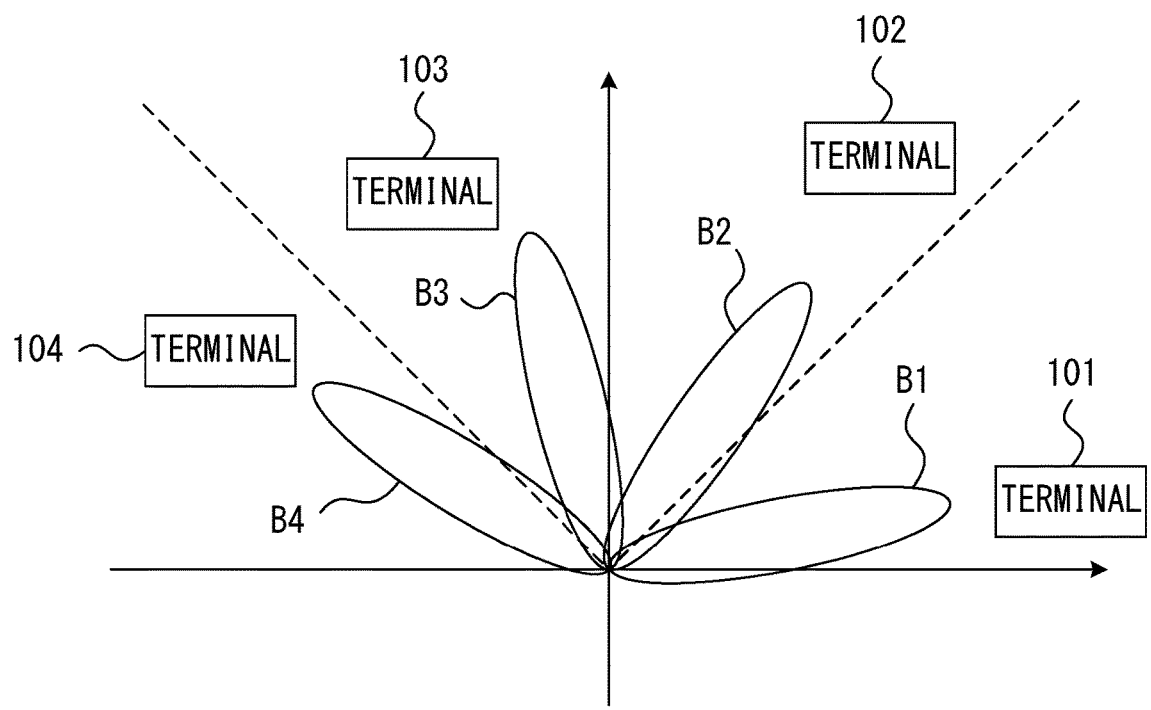
F I G. 6 B

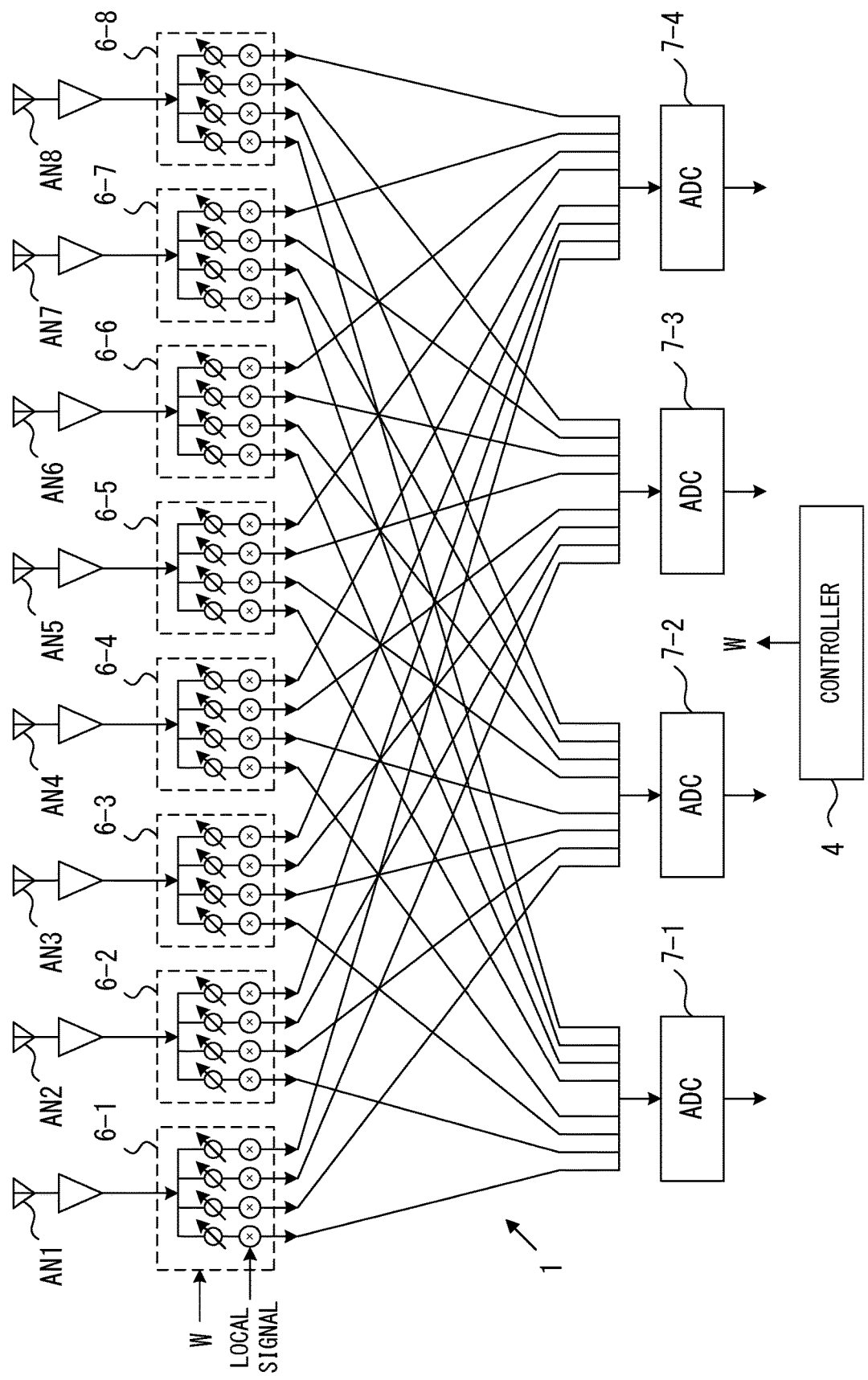
F I G. 1 0

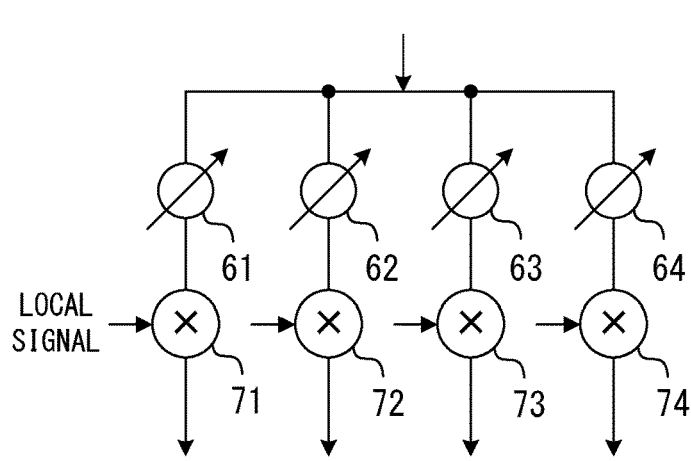
F I G. 1 1 A
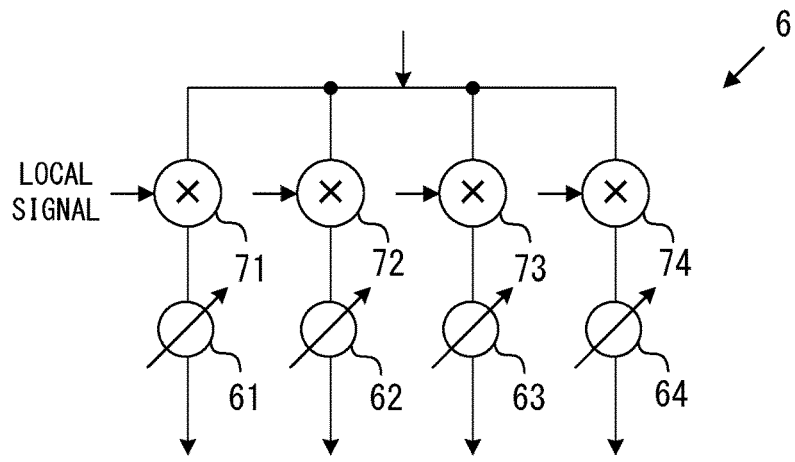
F I G. 1 1 B
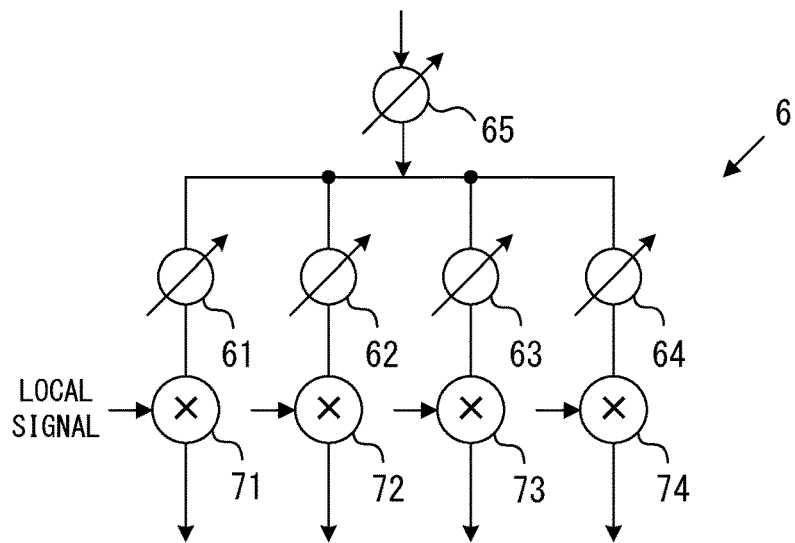
F I G. 1 1 C

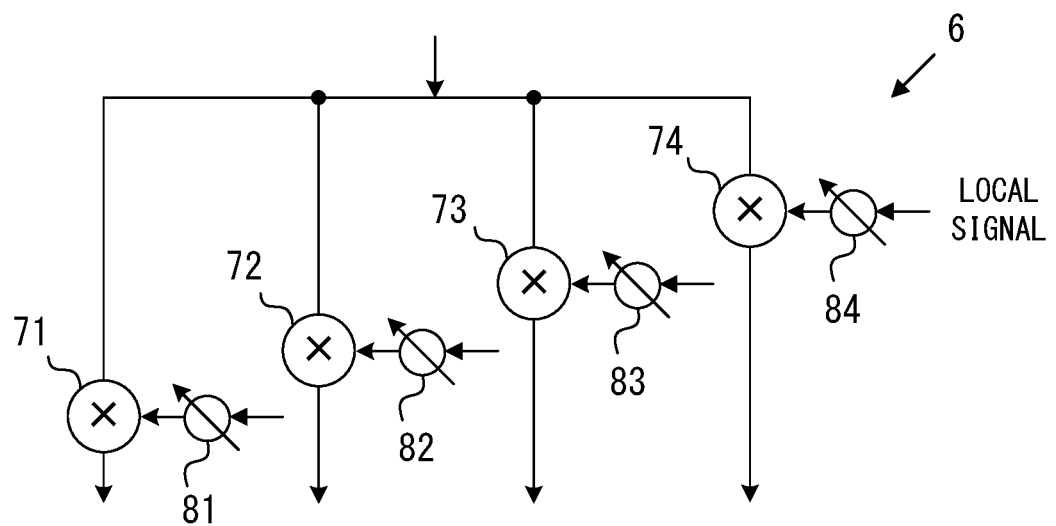
F I G. 1 2 A
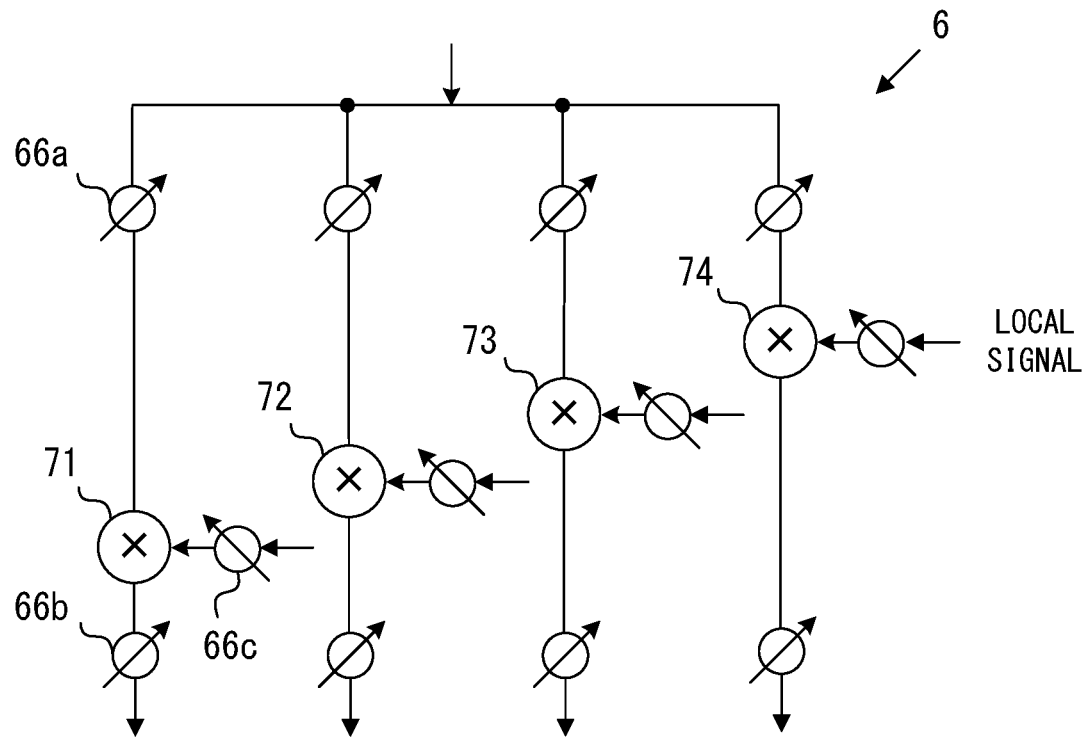
F I G. 1 2 B

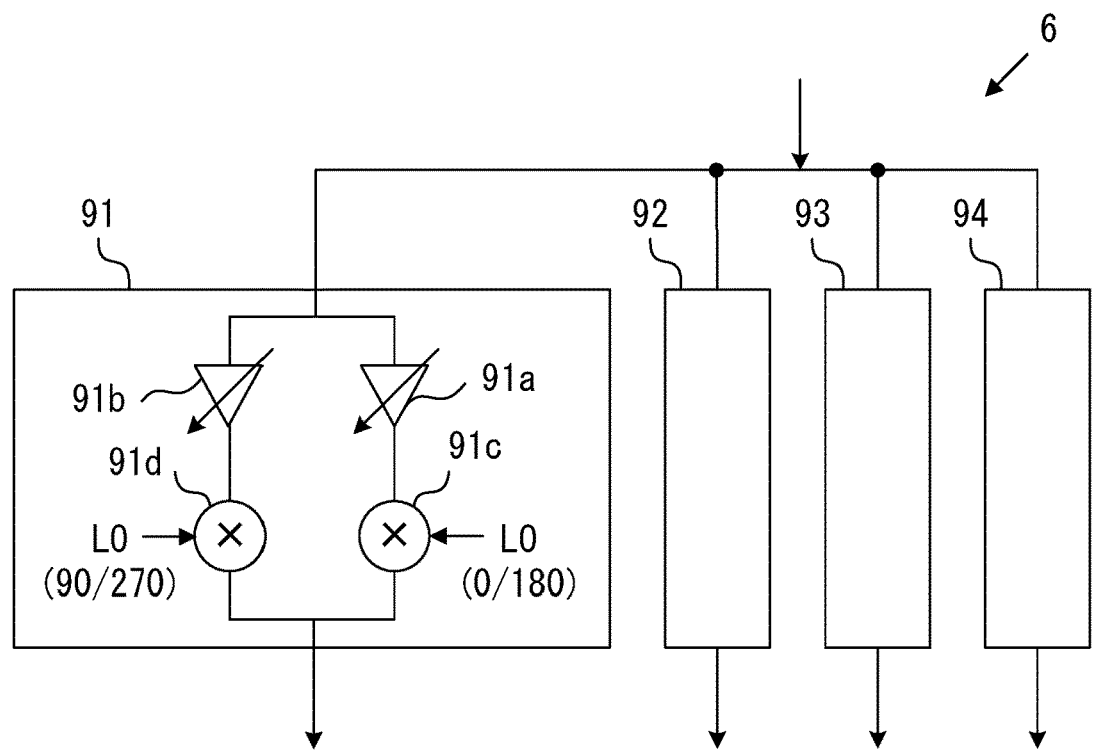
F I G. 1 3 A
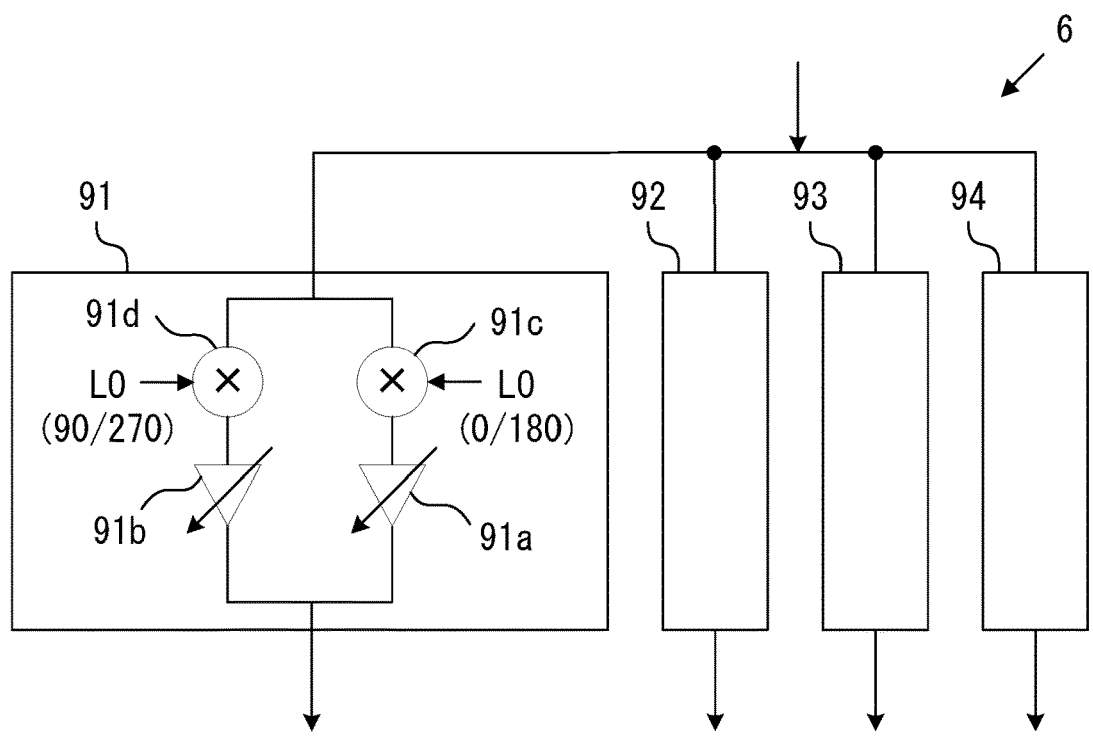
F I G. 1 3 B

BEAM FORMING DEVICE AND BEAM FORMING METHOD

CROSS-REFERENCE TO RELATED APPLICATION

This application is based upon and claims the benefit of priority of the prior Japanese Patent Application No. 2019-129568, filed on Jul. 11, 2019, the entire contents of which are incorporated herein by reference.

FIELD

The embodiments discussed herein are related to a beam forming device and a beam forming method used in a radio system.

BACKGROUND

In recent years, beam forming has been put into practical use as one technique for realizing the multiplexing of communications or accurate sensing (radar) in a high frequency band (e.g., microwave band, millimeter-wave band). A beam forming device for implementing beam forming includes a plurality of antenna elements arranged in an array.

The beam forming device forms beams for respective terminals by using the plurality of antenna elements. For example, the beam forming device may control the direction and shape of a transmission beam by controlling the phase and/or amplitude of signals transmitted via each antenna element in accordance with the position of the terminal. The beam forming device may also control the direction and shape of a reception beam by controlling the phase and/or amplitude of signals received via each antenna element in accordance with the position of the terminal.

In addition, there has been development in schemes wherein a plurality of different signals are superimposed and beams are formed for different directions (beam multiplexing). Fully digital beam forming has been proposed as one method for implementing beam multiplexing.

In fully digital beam forming, the phases and/or amplitudes of signals transmitted or received via antenna elements are controlled through digital processing. Thus, the beam forming device for performing fully digital beam forming (this device may hereinafter be referred to as a "fully digital beam forming device") includes a digital-to-analog converter (DAC) for each of the antenna elements so as to form transmission beams. Accordingly, the fully digital beam forming device includes as many DACs as the number of antenna elements. The fully digital beam forming device also includes as many analog-to-digital converters (ADCs) as the number of antenna elements so as to form reception beams. Power consumption of the DAC/ADC is dependent on the rate of a data signal. Hence, in a wide band communication system using a millimeter-wave band or the like, power consumption of a beam forming device will increase when the rate of a data signal is enhanced.

Analog full connection beam forming has been proposed as another method for implementing beam forming. FIG. 1 depicts an example of a beam forming device for implementing analog full connection beam forming (this device may hereinafter be referred to as an "analog full connection beam forming device").

The beam forming device depicted in FIG. 1 includes four DACs to accommodate four terminals. Each DAC converts a signal to be transmitted to a corresponding terminal into an analog signal. However, the beam forming device preferably includes more antenna elements than the number of terminals (i.e., the number of signals). In the example depicted in FIG. 1, the beam forming device includes eight antenna elements. In this case, signals S1-S4 to be transmitted to the terminals are up-converted into signals in an RF band by using local signals and then distributed to phase control circuits. Each phase control circuit controls the phases and/or amplitudes of the signals S1-S4. An output signal of each phase control circuit is output via an antenna element. Each phase control circuit controls the phases of the signals S1-S4 in accordance with the positions of the terminals. Thus, beams for respective terminals are formed.

Configurations and operations for beam forming are described in, for example, International Publication Pamphlet No. WO 2017/135389.

In comparison with a fully digital beam forming device, an analog full connection beam forming device has few DACs and thus has reduced power consumption. However, in an analog full connection beam forming device, many signal lines intersect between DACs and phase control circuits. In the example depicted in FIG. 1, thirty-two signal lines are provided between the four DACs and the eight phase control circuits. In the analog full connection beam forming device, high-speed signals (e.g., signals in an RF band) are transmitted via such signal lines. Hence, such a device would have a large signal loss and be difficult to be put into practical use.

The above-described problem may be solved by adding a circuit for compensating for the loss. However, such a configuration requires a space for a loss compensation circuit and thus would not be preferable in a case where a beam forming device needs to have a reduced size. In addition, power consumption could be increased due to the addition of the loss compensation circuit.

SUMMARY

According to an aspect of the embodiments, a beam forming device includes: a plurality of control circuits that each control at least either phases or amplitudes of a plurality of input signals to generate a transmission signal; and a plurality of antenna elements that each output the transmission signal generated by a corresponding control circuit. A frequency range of the transmission signal generated by each of the control circuits is higher than frequency ranges of the input signals.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 illustrates an example of a conventional beam forming device;

FIGS. 4A-4C illustrate configuration examples of a phase control circuit;

FIGS. 6A and 6B illustrate examples of phase control based on the configuration depicted in FIG. 5;

FIG. 10 illustrates an example of a beam forming device for forming reception beams; and FIGS. 11A-11C, 12A-12B, and 13A-13B illustrate configuration examples of a phase control circuit implemented in a reception circuit.

DESCRIPTION OF EMBODIMENTS

Figure 2:
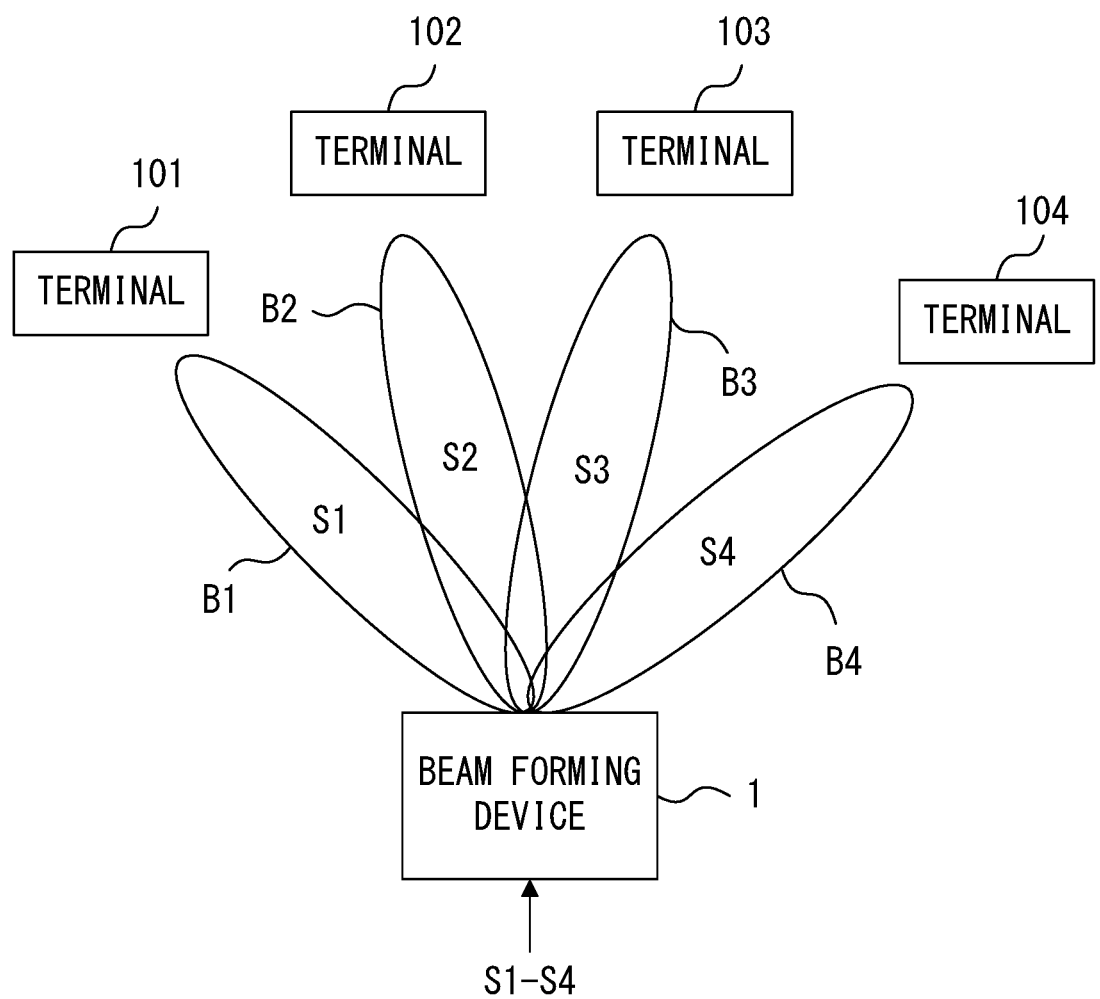
FIG. 2 illustrates an example of a radio system in accordance with embodiments of the invention.

FIG. 2 illustrates an example of a radio system in accordance with embodiments of the invention. In this example, the radio system includes a beam forming device 1 and a plurality of terminals 101-104. The beam forming device 1 may be implemented in, for example, a base station in a radio communication system, but the invention is not particularly limited to this implementation. In this case, each terminal may be user equipment such as a smartphone.

The beam forming device 1 can form a transmission beam for transmitting a signal to each terminal and a reception beam for receiving a signal from each terminal. Accordingly, the beam forming device 1 includes a transmitter circuit that forms transmission beams and a receiver circuit that forms reception beams. The following describes the transmitter circuit that forms transmission beams.

The beam forming device 1 is supplied with a signal to be transmitted to each terminal. For example, the beam forming device 1 may be supplied with signals S1-S4 to be respectively transmitted to the terminals 101-104. Then, the beam forming device 1 forms transmission beams B1-B4 for respectively transmitting the signals S1-S4 to the terminals 101-104. The transmission beam B1 is formed to transmit the signal S1 from the beam forming device 1 to the terminal 101. Thus, the transmission beam B1 is formed in a direction from the beam forming device 1 toward the terminal 101. Similarly, the transmission beams B2-B4 are respectively formed to transmit the signals S2-S4 from the beam forming device 1 to the terminals 102-104. In this way, the beam forming device 1 can concurrently form a plurality of transmission beams. In this case, the beam forming device 1 can control the directions and shapes of the transmission beams separately for each transmission beam in accordance with the positions of the terminals. Accordingly, the beam forming device 1 implements beam multiplexing.

First Embodiment

Figure 3:
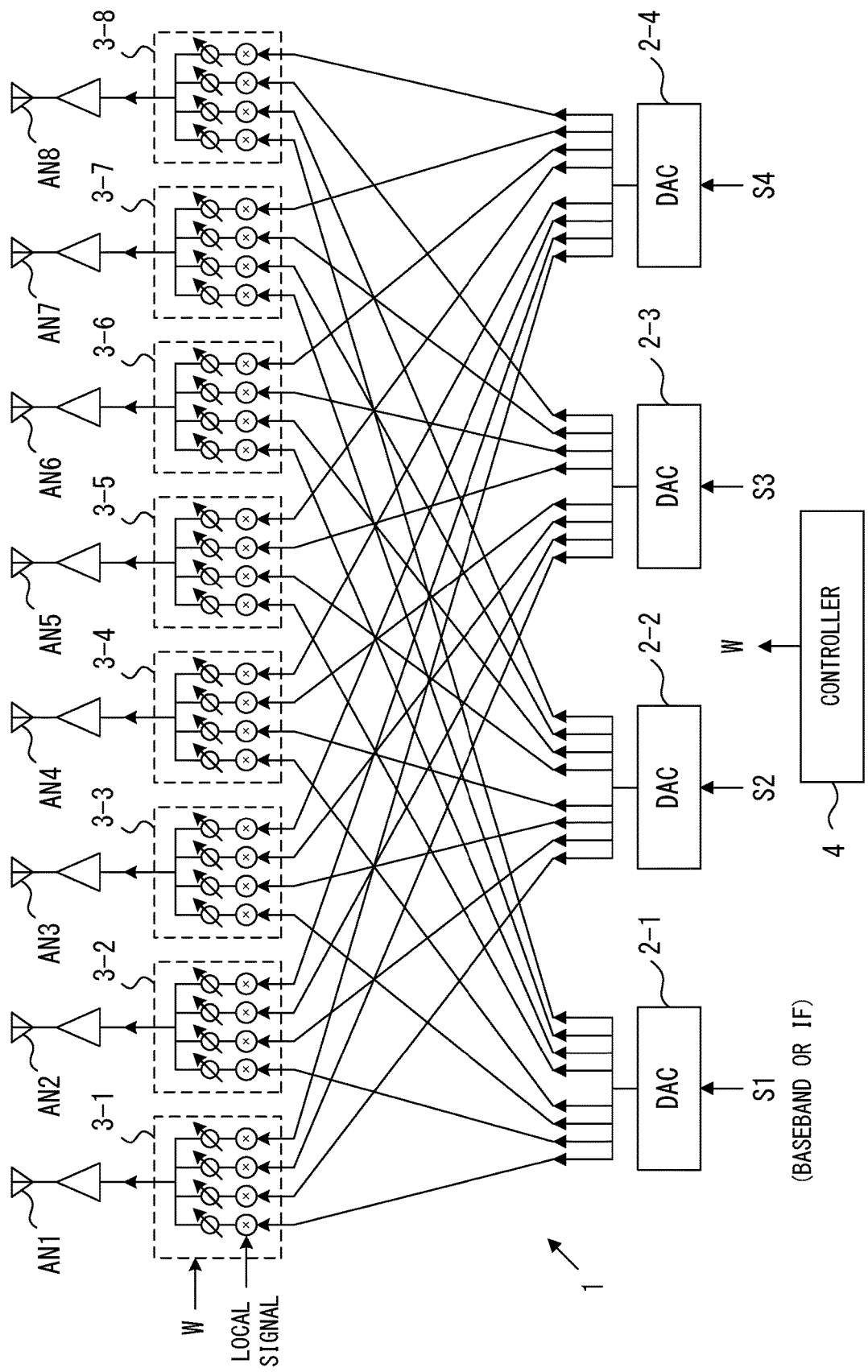
FIG. 3 illustrates an example of a beam forming device in accordance with embodiments of the invention.

FIG. 3 illustrates an example of a beam forming device 1 in accordance with embodiments of the invention. In this example, the beam forming device 1 includes a plurality of digital-to-analog converters (DACs) 2 (2-1 to 2-4), a plurality of phase control circuits 3 (3-1 to 3-8), a plurality of antenna elements AN1 to AN8, and a controller 4. The beam forming device 1 configures an analog full connection beam forming device. The beam forming device 1 may include other circuits that are not depicted in FIG. 3. Note that the receiver circuit for forming reception beams is not depicted in FIG. 3.

The number of DACs provided in the beam forming device 1 is equal to the number of beams that the beam forming device 1 can form or the number of terminals that can be accommodated in the beam forming device 1. In this example, the beam forming device 1 can accommodate four terminals. Thus, the beam forming device 1 includes four DACs 2-1 to 2-4.

The number of antenna elements provided in the beam forming device 1 is preferably larger than the number of terminals that can be accommodated in the beam forming device 1. In this example, the beam forming device 1 includes eight antenna elements AN1 to AN8. The antenna elements AN1 to AN8 may be aligned in an array. That is, the beam forming device 1 includes an array antenna system.

The number of phase control circuits provided in the beam forming device 1 is equal to the number of antenna elements. In particular, one phase control circuit is provided for each antenna element. In this example, eight phase control circuits 3-1 to 3-8 are provided for the eight antenna elements AN1 to AN8.

In the example depicted in FIG. 3, eight antenna elements are aligned in one line (one-dimensionally arranged). However, the invention is not limited to this configuration. In particular, the plurality of antenna elements may be two-dimensionally arranged or may be three-dimensionally arranged.

The controller 4 generates a phase control signal (weight W in the example described in the following) for forming a transmission beam according to the position of each terminal. In particular, the controller 4 generates phase control signals for forming transmission beams B1 to B4 according to the positions of the terminals 101 to 104. The phase control signals are given to the phase control circuits 3-1 to 3-8.

In the beam forming device 1, the signals S1 to S4 are respectively supplied to the DACs 2-1 to 2-4. In this example, the signals S1 to S4 are digital signals in a baseband region or an IF (intermediate frequency) band. The intermediate frequency is not particularly limited and is about 1 GHz or lower in this example. The DACs 2-1 to 2-4 respectively convert the digital signals S1 to S4 into analog signals S1 to S4 in the baseband region or the intermediate frequency band.

Output signals of the DACs 2-1 to 2-4 are guided to the phase control circuits 3-1 to 3-8. In particular, the signal S1 output from the DAC 2-1 is distributed to the phase control circuits 3-1 to 3-8. The signal S2 output from the DAC 2-2 is distributed to the phase control circuits 3-1 to 3-8. The signal S3 output from the DAC 2-3 is distributed to the phase control circuits 3-1 to 3-8. The signal S4 output from the DAC 2-4 is distributed to the phase control circuits 3-1 to 3-8.

Accordingly, each of the phase control circuits 3-1 to 3-8 receives the output signals of the DACs 2-1 to 2-4. In particular, the phase control circuit 3-1 receives the signal S1 output from the DAC 2-1, the signal S2 output from the DAC 2-2, the signal S3 output from the DAC 2-3, and the signal S4 output from the DAC 2-4. Similarly, each of the phase control circuits 3-2 to 3-8 also receives the signals S1 to S4.

Each of the phase control circuits 3-1 to 3-8 controls at least either the phases or amplitudes of the output signals of the DACs 2-1 to 2-4 so as to generate a transmission signal. That is, each of the phase control circuits 3-1 to 3-8 generates a transmission signal by controlling at least either the phases or amplitudes of the signals S1 to S4 output from the DACs 2-1 to 2-4.

Signal processing performed by the phase control circuits 3-1 to 3-8 may be expressed using "weights". Thus, output signals Sout_1 to Sout_8 of the phase control circuits 3-1 to 3-8 are expressed by the following formula (1).

$$\begin{pmatrix} W_{1,1} & \cdots & W_{1,M} \\ \vdots & \ddots & \vdots \\ W_{N,1} & \cdots & W_{N,M} \end{pmatrix} \begin{pmatrix} S_{in\_1} \\ \vdots \\ S_{in\_M} \end{pmatrix} = \begin{pmatrix} S_{out\_1} \\ \vdots \\ S_{out\_N} \end{pmatrix} \quad (1)$$

Sin_i indicates a signal output from a DAC 2-*i* and input to the phase control circuits 3-1 to 3-8. In the example depicted in FIG. 3, M is 4, and i is 1 to 4.

Sout_j indicates a signal output from a phase control circuit 3-*j*. In the example depicted in FIG. 3, N is 8, and j is 1 to 8.

$W_{j,i}$ indicates a weight assigned to a signal input from a DAC 2-*i* to a phase control circuit 3-*j*. A weight W indicates at least either the phase or amplitude of a signal. For example, a weight W may be expressed as a complex number.

Accordingly, the output signal of each of the phase control circuits 3-1 to 3-8 is generated by assigning corresponding weights W to the output signals of the DACs 2-1 to 2-4 and then summing these signals. For example, the output signal Sout_1 of the phase control circuit 3-1 may be expressed by the following formula (2).

$$S_{out\_1} = W_{1,1} S_{in\_1} + W_{1,2} S_{in\_2} + W_{1,3} S_{in\_3} + W_{1,4} S_{in\_4} \quad (2)$$

Weights W are calculated by the controller 4 according to the position of a terminal that is a destination of a signal. For example, when the signal S1 is transmitted to the terminal 101 depicted in FIG. 2, weights $W_{1,1}$ to $W_{N,1}$ may be calculated according to the position of the terminal 101 with respect to the beam forming device 1. When the signal S2 is transmitted to the terminal 102, weights $W_{1,2}$ to $W_{N,2}$ are calculated according to the position of the terminal 102 with respect to the beam forming device 1. Weights W are updated according to movement of a terminal, a radio environment between the beam forming device 1 and the terminal, or the like.

In addition, the phase control circuits 3-1 to 3-8 have a function for up-converting an input signal in the baseband region or the intermediate frequency band into a signal in a radio frequency band (or a millimeter-wave band). The radio frequency band is not particularly limited and is 1 GHz or higher in this example. The radio frequency band also includes a millimeter-wave band. The transmission signals generated by the phase control circuits 3-1 to 3-8 (Sout_1 to Sout_8) are respectively output via the antenna elements AN1 to AN8. As a result, the transmission beams B1 to B4 depicted in FIG. 2 are formed. Note that, as depicted in FIG. 3, the beam forming device 1 may include amplifiers respectively between the phase control circuits 3-1 to 3-8 and the antenna elements AN1 to AN8.

Accordingly, the carrier frequencies of signals transmitted between DACs and the phase control circuits in the configuration depicted in FIG. 3 are lower than those in the configuration depicted in FIG. 1. In particular, signals in the radio frequency band are transmitted between the DACs and the phase control circuits in the configuration depicted in FIG. 1. By contrast, signals in the baseband region or signals in the intermediate frequency band are transmitted between the DACs and the phase control circuits in the configuration depicted in FIG. 3. Hence, signal loss will be smaller than that in the configuration depicted in FIG. 1.

FIGS. 4A-4C illustrate configuration examples of a phase control circuit. In these examples, the beam forming device 1 includes four DACs (2-1 to 2-4). The phase control circuits 3 correspond to the phase control circuits 3-1 to 3-8 depicted in FIG. 3. Thus, each of the phase control circuits 3 is supplied with signals S1 to S4 output from the DACs 2-1 to 2-4.

In the example depicted in FIG. 4A, the phase control circuit 3 includes mixers 11 to 14 and phase shifters 21 to 24. Signals S1 to S4 are respectively input to the mixers 11 to 14. Each of the mixers 11 to 14 is supplied with a local signal. Although FIG. 4A indicates that only the mixer 11 is supplied with a local signal, the mixers 12 to 14 are actually supplied with the same local signal. The local signal is generated by an oscillator (not illustrated). The frequency of the local signal is, for example, a few to tens of gigahertz. For example, the local signal may be, but is not particularly limited to, a sinusoidal signal. The mixers 11 to 14 respectively up-convert the signals S1 to S4 into signals in the radio frequency band by multiplying the signals S1 to S4 by the local signal.

The phase shifters 21 to 24 control the phase of the up-converted signals S1 to S4 in the radio frequency band. Each of the phase shifters 21 to 24 can implement a desired phase shift within a range from 0° to 360°. Each of the phase shifters 21 to 24 controls the phase of an input signal in accordance with the weight W described above by referring to formula (1). For example, phase control that corresponds to formula (2) may be performed in the phase control circuit 3-1 depicted in FIG. 3. In this case, the phase shifters 21, 22, 23, and 24 respectively perform phase controls indicated by weights $W_{1,1}$, $W_{1,2}$, $W_{1,3}$, and $W_{1,4}$.

Output signals of the phase shifters 21 to 24 are multiplexed. As a result, a transmission signal to be output via a corresponding antenna element is generated.

As described above, in the configuration depicted in FIG. 4A, the signals S1 to S4 are up-converted into signals in the radio frequency band, and then the phases of the signals S1 to S4 are controlled. That is, phase control is performed in the radio frequency band. Thus, the proportion of the signal band to the carrier frequency is small even when the bandwidth of the signals S1 to S4 is wide. Hence, group delay differences are small in the signal band. Accordingly, the phase shifters 21 to 24 can each easily implement desired phase control for the entirety of the signal band. Meanwhile, in the configuration depicted in FIG. 3, the frequency of signals transmitted between the DACs 2-1 to 2-4 and the phase control circuits 3-1 to 3-8 is low, and hence signal loss will be small even if there are many intersections of signal lines. Accordingly, the configurations depicted in FIGS. 3 and 4A realize both a reduction in signal loss and wide band communications.

Implementing variable-amplitude phase shifters as the phase shifters 21 to 24 allows the phase control circuit 3 to concurrently control the phase and amplitude of a signal. In particular, the phase control circuit 3 realizes phase amplitude weighting. Accordingly, the "phase control" mentioned in the following description pertaining to the first embodiment includes not only cases in which only phases are controlled but also cases in which both phases and amplitudes are controlled.

In the example depicted in FIG. 4B, the phase control circuit 3 also includes mixers 11 to 14 and phase shifters 21 to 24. However, in the configuration depicted in FIG. 4B, the phase shifters 21 to 24 are provided on the input sides of the mixers 11 to 14. In this case, the phases (or both phases and amplitudes) of the signals S1 to S4 are controlled in the baseband region or the intermediate frequency band. In the example depicted in FIG. 4B, the signals are up-converted by the mixers 11 to 14. However, these signals may be up-converted by one mixer after being multiplexed.

In the examples depicted in FIGS. 4A and 4B, the phases of the input signals S1 to S4 are directly controlled. By contrast, in the example depicted in FIG. 4C, the phase of a local signal to be used for up-conversion is controlled. In particular, the phase shifters 31 to 34 each control the phase of a local signal in accordance with a weight W assigned by the controller 4. Then, the mixers 11 to 14 respectively multiply the signals S1 to S4 by output signals of the phase shifters 31 to 34. Specifically, the mixers 11 to 14 multiply the signals S1 to S4 by phase-controlled local signals.

Figure 5:
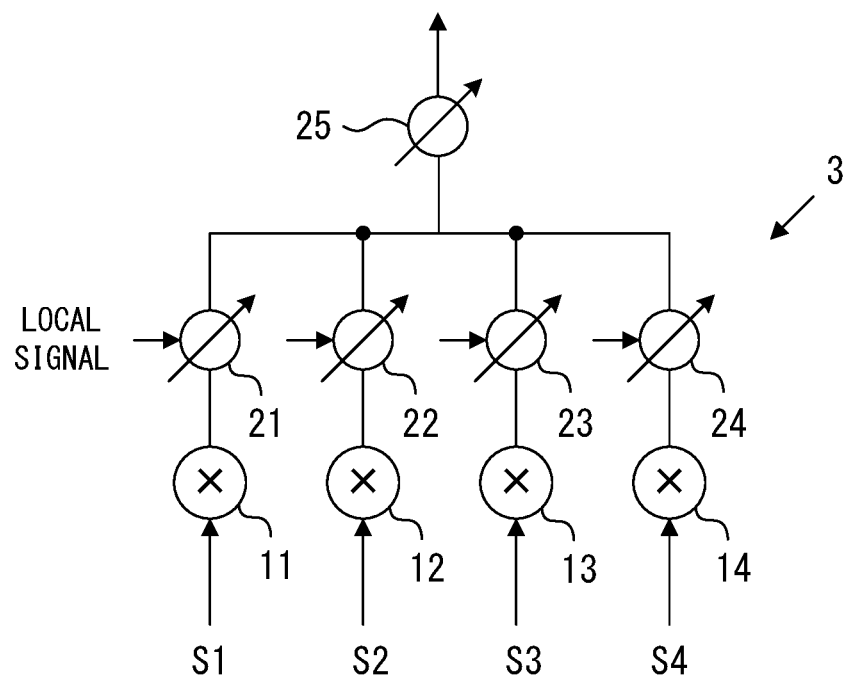
FIG. 5 illustrates another configuration example of a phase control circuit.

FIG. 5 illustrates another configuration example of the phase control circuit. In this example, the phase control circuit 3 includes mixers 11 to 14, phase shifters 21 to 24, and a phase shifter 25. The phase shifters 21 to 24 respectively control the phases of signals S1 to S4 before these signals are multiplexed. After the signals S1 to S4 are multiplexed, the phase shifter 25 controls the phase of the multiplexed signal. Thus, phase control is performed in two stages in the configuration depicted in FIG. 5. The phase shifters 21 to 24 are provided on the output sides of the mixers 11 to 14 in the example depicted in FIG. 5 but may be provided on the input sides of the mixers 11 to 14.

The phase shifters 21 to 24 can attain desired phases within a range from 0° to 360°. However, the phase shifters 21 to 24 each control the phase of a signal with a coarse phase control step. A phase control step can be expressed as "360/(L×M)" degrees (L is a natural number), where M is the number of terminals that the beam forming device 1 can concurrently accommodate (or the number of beams that the beam forming device 1 can concurrently form). Thus, the phase control step is, for example, "360/M" degrees (L=1) or "360/2M" degrees (L=2). In this example, M is 4. In this case, the phase control step of the phase shifters 21 to 24 is 90° or 45°.

The beam forming device 1 can form transmission beams B1 to B4 by using the phase shifters 21 to 24 of the phase control circuits 3-1 to 3-8. When the phase control step of each of the phase shifters 21 to 24 is an angle of 90°, transmission beams can be formed in four angle regions as depicted in FIG. 6A. For example, by using the phase shifters 21 of the phase control circuits 3-1 to 3-8, the beam forming device 1 may form a transmission beam B1 for transmitting a signal S1 in a first angle region. By using the phase shifters 22 of the phase control circuits 3-1 to 3-8, the beam forming device 1 also forms a transmission beam B2 for transmitting a signal S2 in a second angle region. Similarly, transmission beams B3 and B4 are respectively formed in third and fourth angle regions. Note that each of the transmission beams may be formed approximately at the center in the selected angle region by adjusting the phase shifters 25 of the phase control circuits 3-1 to 3-8.

When the phase control step of each of the phase shifters 21 to 24 is an angle of 45°, the beam forming device 1 can form transmission beams in four arbitrary angle regions of the total of eight angle regions obtained by dividing in half each of the four angle regions that would be established if the phase control step was an angle of 90°. The beam forming device 1 determines in which region of the eight angle regions each terminal (in this example, four terminals 101 to 104) is located. In accordance with the result of determination, the beam forming device 1 forms transmission beams B1 to B4 by using the phase shifters 21 to 24. Setting a larger value as L will increase the number of angle regions and thus make the angle regions narrower since each angle region is divided into more regions.

The phase shifter 25 adjusts the directions of the transmission beams formed by the phase shifters 21 to 24. The phase shifter 25 controls the phase of a signal with a fine phase control step than the phase shifters 21 to 24. However, the phase shifter 25 does not need to perform phase control across a range from 0° to 360°. For example, the phase shifter 25 may attain a desired phase within the range of 0 to "360/M" degrees when the phase control step of each of the phase shifters 21 to 24 is "360/M" degrees. When the phase control step of each of the phase shifters 21 to 24 is "360/2M" degrees, the phase shifter 25 may attain a desired phase within the range of 0 to "360/2M" degrees.

FIG. 6B depicts an example of an adjustment for the transmission beams made by the phase shifter 25. Assume that the phase shifters 21 to 24 form the transmission beams B1 to B4 depicted in FIG. 6A.

The beam forming device 1 can adjust the directions of the transmission beams B1 to B4 by using the phase shifters 25 of phase control circuits 3-1 to 3-8. However, the phase shifters 25 collectively control the phases of signals obtained by multiplexing the signals S1 to S4. Thus, the directions of the transmission beams B1 to B4 are collectively adjusted as depicted in FIG. 6B.

The phase shifters 25 perform phase control based on the positions of terminals. As an example, the amount of phase adjustment to be made by each of the phase shifters 25 may be determined such that transmission beams directed toward as many terminals as possible can be formed. In, for example, the state depicted in FIG. 6A, only the transmission beam B3 is directed toward a terminal. By contrast, in the state depicted in FIG. 6B, the transmission beams B1, B2, and B4 are directed toward terminals. According to this method, the base station can accommodate more terminals. Alternatively, the amount of phase adjustment to be made by each of the phase shifters 25 may be determined such that transmission beams directed toward terminals with a high priority are formed. In this case, communications with terminals with a high priority are ensured.

As described above, the phase control circuit 3 depicted in FIG. 5 performs phase control in two stages. The phase shifters 21 to 24 serve to form transmission beams within angle regions to which terminals belong, and the phase shifter 25 serves to adjust the angles of the transmission beams formed by the phase shifters 21 to 24. Thus, the phase shifters 21 to 24 only need to control the phases of signals with a coarse phase control step and thus can have a simple circuit configuration. As a result, the phase control circuits 3 can have reduced size.

Assume that the granularity (or precision) of the phase control is expressed by 10 bits. This bit length is introduced for descriptive purposes and indicates the granularity of the control of direction of a transmission beam. In this example, the longer the bit length is, the more minutely the direction of the transmission beam is controlled. However, as the bit length becomes longer (i.e., as the granularity of the control of direction of the transmission beam becomes finer), the circuit of the phase shifter becomes more complicated, thereby increasing the circuit size.

Figure 7A:
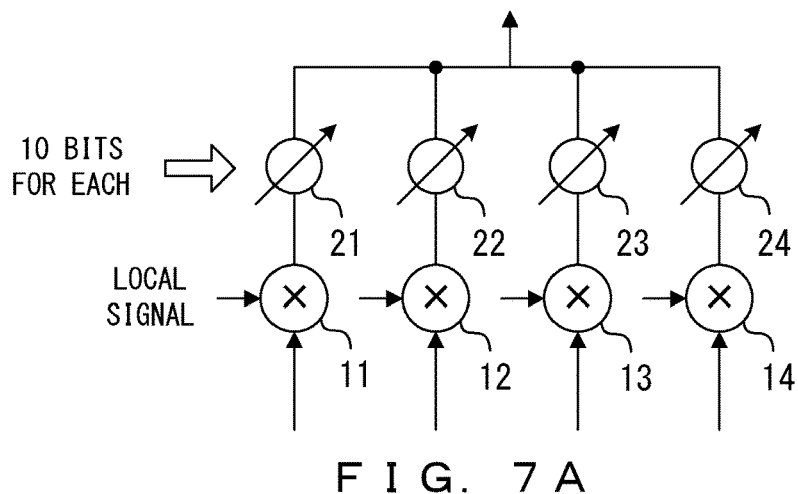
FIGS. 7A-7C illustrate effects implemented by dividing a phase shifting function.

In the phase control circuits depicted in FIGS. 4A-4C, the phase of each of the signals S1 to S4 is controlled with a granularity of 10 bits, as depicted in FIG. 7A. In this case, the beam forming device 1 can form each of the transmission beams B1 to B4 in a desired direction. However, the configurations of the phase shifters 21 to 24 will be complicated, resulting in an increase in the size of the phase control circuit. It is assumed that the size of the phase control circuit is dependent on the sum of the bit lengths indicating the granularities of the phase shifters. Hence, the size of the phase control circuit corresponds to "40 bits".

Figure 7B:
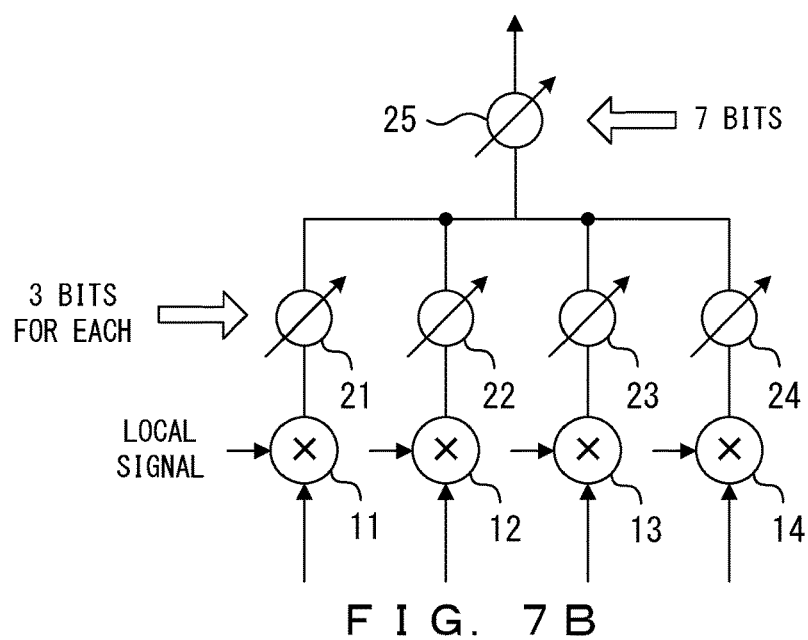

In the phase control circuit depicted in FIG. 5, 10-bit phase control is implemented by the phase shifters on the first stage and the phase shifter on the second stage. Assume, as an example, that 3-bit phase control is performed by each of the phase shifters on the first stage (21 to 24) and 7-bit phase control is performed by the phase shifter on the second stage (25), as depicted in FIG. 7B. The 3-bit phase control corresponds to a state in which the phase control step is 45°. In this case, the configurations of the phase shifters 21 to 24 are simpler than those depicted in FIGS. 4A-4C. As a result, the size of the phase control circuit corresponds to "19 bits". Thus, the size of the phase control circuit can be reduced in comparison with those in the configurations depicted in FIGS. 4A-4C. However, this configuration involves a decrease in degree of freedom for the direction of formation of each transmission beam in comparison with the configurations depicted in FIGS. 4A-4C.

Figure 7C:
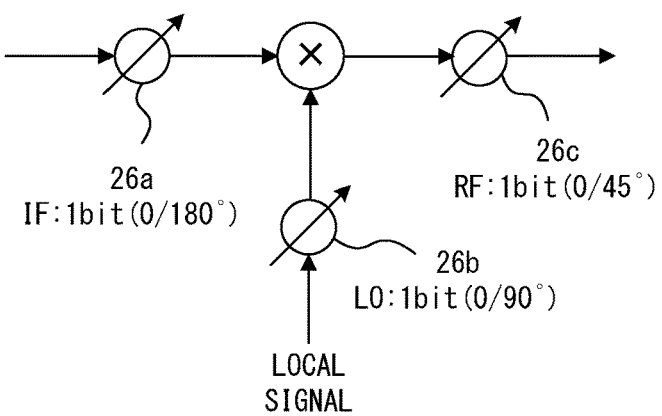

Each of the phase shifters 21 to 24 may be implemented by a plurality of phase shifters. In, for example, the example depicted in FIG. 7C, each of the phase shifters 21 to 24 is implemented by three phase shifters 26a to 26c in a case where each of the phase shifters 21 to 24 performs 3-bit phase control. The phase shifter 26a is provided on the input side of a mixer and performs phase control corresponding to one bit. The phase shifter 26b performs phase control corresponding to one bit for a local (LO) signal for up-conversion. The phase shifter 26c is provided on the output side of the mixer and performs phase control corresponding to one bit. In the example depicted in FIG. 7C, the phase shifter 26a selects a phase difference of 180°, the phase shifter 26b selects a phase difference of 90°, and the phase shifter 26c selects a phase difference of 45°. In this example, phase control corresponding to one bit is implemented by a simple circuit that generates a pair of binary signals and selects one of these signals. Thus, this configuration allows the size of the phase control circuit to be made even smaller.

Second Embodiment

The configurations of the beam forming devices in the first and second embodiments are substantially the same. That is, also in the second embodiment, the beam forming device 1 includes, as depicted in FIG. 3, a plurality of digital-to-analog converters (DACs) 2 (2-1 to 2-4), a plurality of phase control circuits 3 (3-1 to 3-8), a plurality of antenna elements AN1 to AN8, and a controller 4. The beam forming device 1 configures an analog full connection beam forming device. However, the configurations of the phase control circuits 3 are different between the first and second embodiments. The "phase control" mentioned in the following description pertaining to the second embodiment includes not only cases in which only phases are controlled but also cases in which both phases and amplitudes are controlled.

Figure 8:
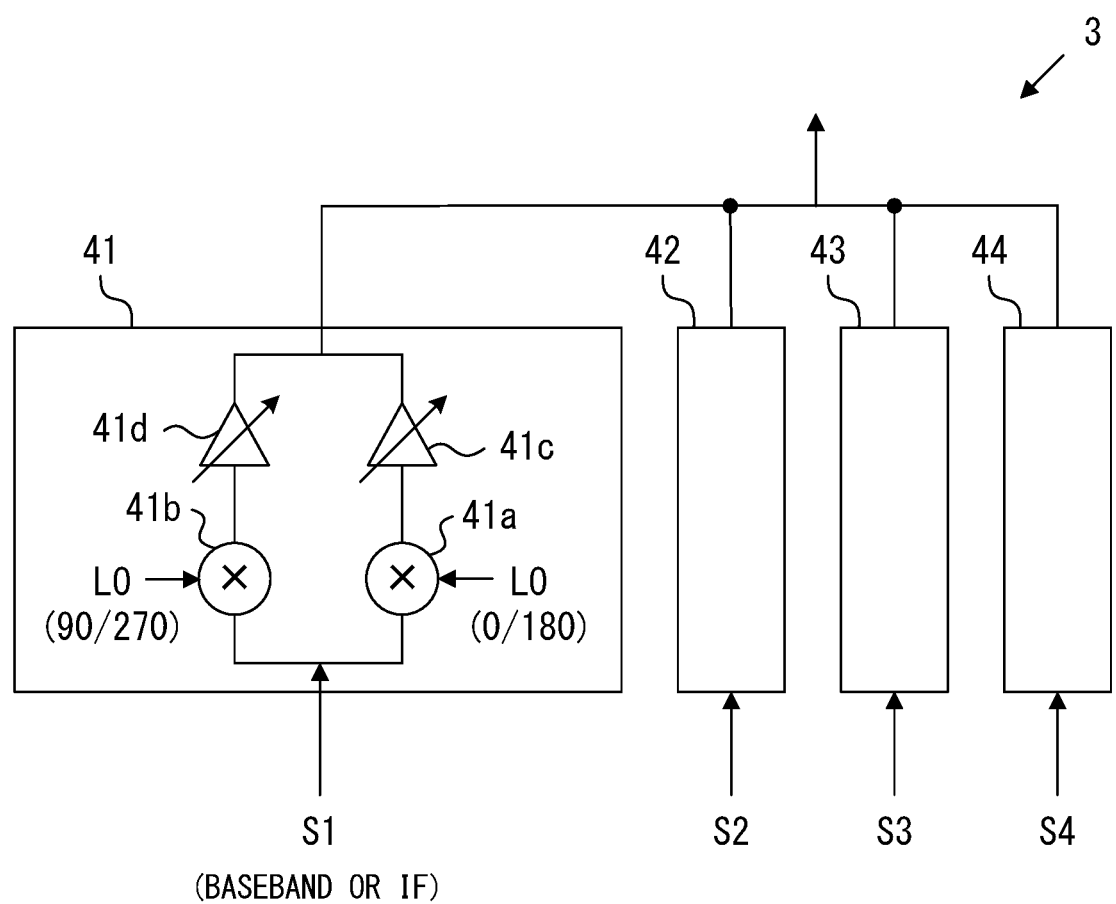
FIG. 8 illustrates an example of a phase control circuit in accordance with a second embodiment.

FIG. 8 illustrates an example of the phase control circuit 3 implemented in the second embodiment. In the second embodiment, the phase control circuit 3 includes a plurality of phase shifter units 41 to 44, as depicted in FIG. 8. The phase shifter units 41 to 44 are provided respectively for the DACs 2-1 to 2-4 depicted in FIG. 3. Thus, the phase shifter units 41 to 44 are respectively supplied with signals S1 to S4 output from the DACs 2-1 to 2-4. The configurations and operations of the phase shifter units 41 to 44 are substantially the same, and the following describes the configuration and operation of the phase shifter unit 41.

The phase shifter unit 41 includes mixers 41a and 41b and variable amplifiers 41c and 41d. The phase shifter unit 41 is supplied with a signal S1 output from a corresponding DAC (in this example, the DAC 2-1 depicted in FIG. 3). In the phase shifter unit 41, the signal S1 is split and guided to the mixers 41a and 41b. The mixers 41a and 41b are supplied with local signals for up-conversion.

The local signal is oscillation signal in a radio frequency band generated by an oscillator (not illustrated). However, the phases of the local signals supplied to the mixers 41a and 41b are controlled by the controller 4. In this example, the mixer 41a is supplied with a local signal having a reference phase or a local signal with a phase shifted from the reference phase by 180°. The mixer 41b is supplied with a local signal with a phase shifted from the reference phase by 90° or a local signal with a phase shifted from the reference phase by 270°. A local signal having a reference phase, a local signal with a phase shifted from the reference phase by 90°, a local signal with a phase shifted from the reference phase by 180°, and a local signal with a phase shifted from the reference phase by 270° may hereinafter be referred to as an LO (0) signal, an LO (90) signal, an LO (180) signal, and an LO (270) signal, respectively.

Which of the LO signals is to be supplied to the mixers 41a and 41b is dependent on how the phase of the signal S1 is controlled. In other words, which of the LO signals is to be supplied to the mixers 41a and 41b is dependent on the weight W described above by referring to formula (1). For example, the phase shifter unit 41 implemented in the phase control circuit 3-1 depicted in FIG. 3 may select an LO signal according to the weight $W_{1,1}$ indicated in formula (1) or (2).

In particular, when the phase of the signal S1 is adjusted to a specified phase within the range of 0° to 90° so as to form a transmission beam B1, the LO (0) signal is supplied to the mixer 41a, and the LO (90) signal is supplied to the mixer 41b. When the phase of the signal S1 is adjusted to a specified phase within the range of 90° to 180°, the LO (180) signal is supplied to the mixer 41a, and the LO (90) signal is supplied to the mixer 41b. When the phase of the signal S1 is adjusted to a specified phase within the range of 180° to 270°, the LO (180) signal is supplied to the mixer 41a, and the LO (270) signal is supplied to the mixer 41b. When the phase of the signal S1 is adjusted to a specified phase within the range of 270° to 360°, the LO (0) signal is supplied to the mixer 41a, and the LO (270) signal is supplied to the mixer 41b. Thus, the mixers 41a and 41b have a function for selecting a quadrant. The mixers 41a and 41b each up-convert the signal S1 into a signal in a radio frequency band by using a local signal supplied to the mixer. As a result, two up-converted signals having phases different from each other are generated from the corresponding input signal (i.e., signal S1).

The variable amplifiers 41c and 41d respectively control the amplitudes of the output signals of the mixers 41a and 41d. The gains of the variable amplifiers 41c and 41d are dependent on how the phase of the signal S1 is controlled. In other words, the gains of the variable amplifiers 41c and 41d are determined based on the weight W described above by referring to formula (1). For example, the phase shifter unit 41 implemented in the phase control circuit 3-1 depicted in FIG. 3 may determine the gains of the variable amplifiers 41c and 41d according to the weight $W_{1,1}$ indicated in formula (1) or (2).

Assume, as an example, that an LO (0) signal is supplied to the mixer 41a, and an LO (90) signal is supplied to the mixer 41d. Thus, the mixers 41a and 41d selects a first quadrant. In this case, to adjust the phase of the signal S1 to, for example, "45°", the gains of the variable amplifiers 41*c* and 41*d* are adjusted to the same value. To adjust the phase of the signal S1 to "0°", the gain of the variable amplifier 41*c* is adjusted to a specified value, and the gain of the variable amplifier 41*d* is adjusted to zero.

As described above, each of the phase shifter units 41 to 44 attains a designated phase by adjusting the amplitudes of the output signals of a pair of mixers. Then, the phase control circuit 3 generates a transmission signal by multiplexing the output signals of the phase shifter units 41 to 44. The transmission signal is output via a corresponding antenna element.

The amplitude of the output signal of the phase control circuit 3 can be varied by varying the gains of the variable amplifiers 41*c* and 41*d* with the ratio between the gains of the variable amplifiers 41*c* and 41*d* fixed. Specifically, "amplitude control" can be performed. Combining the "amplitude control" with the above-described phase settings ("phase control") allows the phase control circuit 3 to implement "phase control" and "amplitude control".

Figure 9:
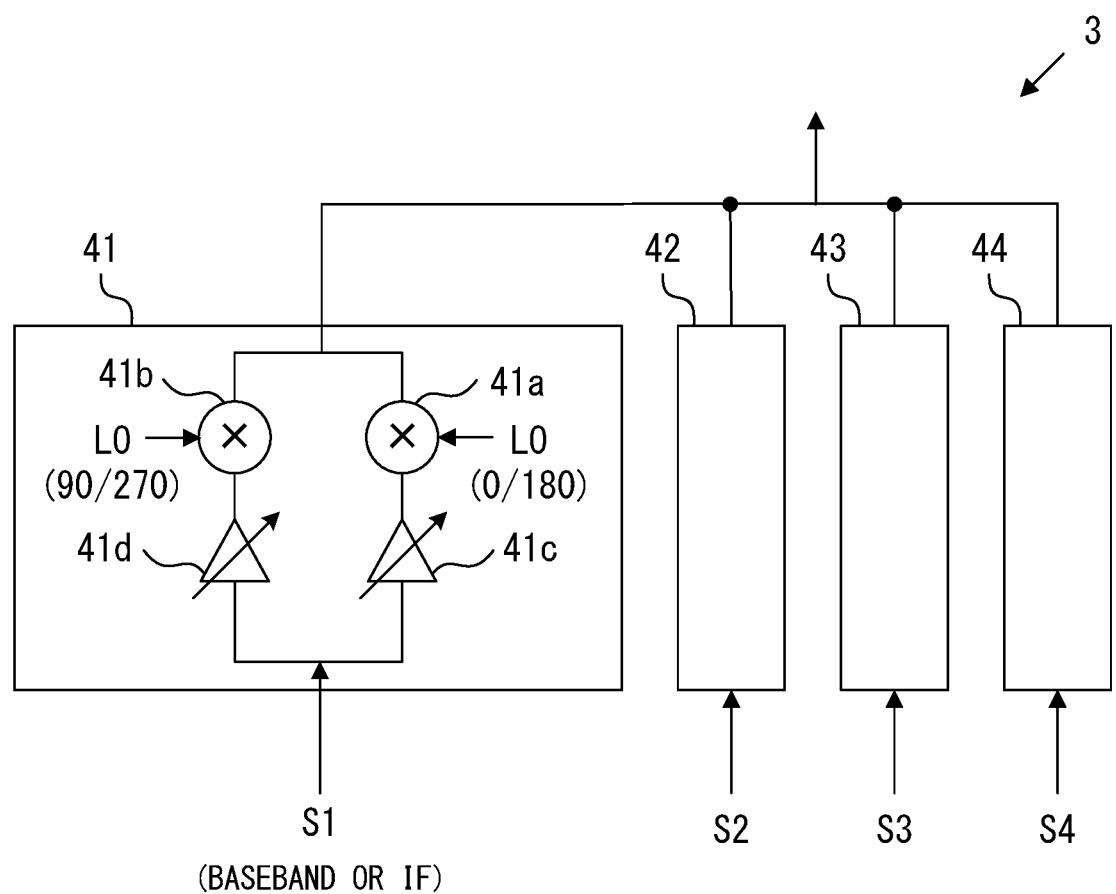
FIG. 9 illustrates another example of a phase control circuit in accordance with a second embodiment.

FIG. 9 illustrates another example of the phase control circuit 3 implemented in the second embodiment. As in the configuration depicted in FIG. 8, the phase control circuit 3 depicted in FIG. 9 includes a plurality of phase shifter units 41 to 44. Each of the phase shifter units 41 to 44 includes mixers 41*a* and 41*b* and variable amplifiers 41*c* and 41*d*. However, in the configuration depicted in FIG. 8, each of the phase shifter units 41 to 44 attains a designated phase by adjusting the amplitudes of the output signals of a pair of mixers. By contrast, in the configuration depicted in FIG. 9, each of the phase shifter units 41 to 44 attains a designated phase by adjusting the amplitudes of input signals of a pair of mixers.

In the configuration depicted in FIG. 9, a signal output from a corresponding DAC (e.g., signal S1) is split and supplied to the variable amplifiers 41*c* and 41*d*. The variable amplifiers 41*c* and 41*d* each control the amplitude of the signal S1 in accordance with a phase designated by the controller 4. The mixers 41*a* and 41*b* respectively up-convert the variable amplifiers 41*c* and 41*d*. In this case, the phases of LO signals supplied to the variable amplifiers 41*c* and 41*d* are controlled in accordance with the phase designated by the controller 4.

Accordingly, in the configuration depicted in FIG. 9, a designated phase is attained by adjusting the amplitudes of input signals of a pair of mixers. In particular, the variable amplifiers 41*c* and 41*d* control the amplitudes of input signals in a low frequency band (in this example, a baseband region or an intermediate frequency band). Thus, the configuration depicted in FIG. 9 can realize more accurate amplitude control than configurations in which amplitudes are controlled in a high frequency band (e.g., a radio frequency band). As a result, the accuracy in phase control of input signals will be increased, and the accuracy in the control of direction of transmission beams will also be increased. Therefore, the communication quality will be enhanced.

As in the configuration depicted in FIG. 8, the amplitude of the output signal of the phase control circuit can be varied by varying the gains of the variable amplifiers 41*c* and 41*d* with the ratio between the gains of the variable amplifiers 41*c* and 41*d* fixed. Specifically, "amplitude control" can be performed. Thus, combining the "amplitude control" with the above-described phase settings ("phase control") allows the phase control circuit 3 to implement "phase control" and "amplitude control".

Reception Beam

FIG. 10 illustrates an example of a beam forming device for forming reception beams. As described above, the beam forming device 1 includes a transmitter circuit that forms a transmission beam and a receiver circuit that forms a reception beam. Accordingly, FIG. 10 depicts an example of a receiver circuit of a beam forming device. The "phase control" mentioned in the following description pertaining to the formation of a reception beam includes not only cases in which only phases are controlled but also cases in which both phases and amplitudes are controlled.

The configuration of the receiver circuit of the beam forming device 1 is substantially the same as that of the transmitter circuit depicted in FIG. 3. However, the receiver circuit includes phase control circuits 6-1 to 6-8, instead of the phase control circuits 3-1 to 3-8 of the transmitter circuit. The receiver circuit also includes analog-to-digital converters (ADCs) 7-1 to 7-4, instead of the DACs 2-1 to 2-4 of the transmitter circuit. The antenna elements AN1 to AN8 may be shared by the transmitter circuit and the receiver circuit. Alternatively, the transmitter circuit may include a plurality of transmission antenna elements, and the receiver circuit may include a plurality of reception antenna elements. In this example, the controller 4 is shared by the transmitter circuit and the receiver circuit.

In the beam forming device 1, signals that arrive at the antenna elements AN1 to AN8 are respectively guided to the phase control circuits 6-1 to 6-8. The phase control circuits 6-1 to 6-8 control the phases of the received signals in accordance with a phase control signal from the controller 4. In this case, each of the phase control circuits 6-1 to 6-8 performs phase control for each terminal. The phase control circuits 6-1 to 6-8 down-convert the received signals into signals in a baseband region or an intermediate frequency band.

The signals with the phases controlled by the phase control circuits 6-1 to 6-8 are guided to ADCs 7-1 to 7-4. For example, signals for which phase control corresponding to the terminal 101 has been performed by the phase control circuits 6-1 to 6-8 may be guided to the ADC 7-1. Similarly, signals for which phase control corresponding to the terminal 102 has been performed by the phase control circuits 6-1 to 6-8 are guided to the ADC 7-2. Signals for which phase control corresponding to the terminal 103 has been performed by the phase control circuits 6-1 to 6-8 are guided to the ADC 7-3. Signals for which phase control corresponding to the terminal 104 has been performed by the phase control circuits 6-1 to 6-8 are guided to the ADC 7-4.

The ADCs 7-1 to 7-4 convert signals received from the phase control circuits 6-1 to 6-8 into digital signals. In particular, each of the ADCs 7-1 to 7-4 converts eight received signals into digital signals. A digital signal processor (not illustrated) recovers data from output signals of the ADCs.

As described above, the receiver circuit of the beam forming device 1 in accordance with embodiments of the invention is such that signals of low frequencies are transmitted between the phase control circuits and ADCs. Specifically, signals in the baseband region or signals in the intermediate frequency band are transmitted between the phase control circuits and the ADCs. Hence, signal loss will be small even if there are many intersections of signal lines.

FIGS. 11A-11C, 12A-12B, and 13A-13B illustrate configuration examples of phase control circuits implemented in the receiver circuit of the beam forming device. Each of the configurations depicted in FIGS. 11A-11C, 12A-12B, and 13A-13B corresponds to any one of the phase control circuits 6-1 to 6-8 illustrated in FIG. 10. The phase control circuit 6 in the following descriptions indicates the phase control circuits 6-1 to 6-8.

The configuration depicted in FIG. 11A corresponds to the phase control circuit 3 illustrated in FIG. 4A. Thus, the phase control circuit 6 implemented in the receiver circuit includes phase shifters 61 to 64 and mixers 71 to 74. The phase shifters 61 to 64 control the phases of received signals. In this example, the received signals include signals in a radio frequency band output from the terminals 101 to 104. The phase shifters 61 to 64 each perform phase control designated by the controller 4. The controller 4 gives phase control signals to the phase shifters 61 to 64 in accordance with the positions of the terminals 101 to 104. The mixers 71 to 74 respectively down-convert output signals of the phase shifters 61 to 64 by using a local signal. The local signal is generated by an oscillator (not illustrated). An output signal of the mixer 71 is guided to the ADC 7-1. Similarly, output signals of the mixers 72 to 74 are respectively guided to the ADCs 7-2 to 7-4.

As described above, in the configuration depicted in FIG. 11A, the phases of received signals are controlled in the radio frequency band. Thus, the proportion of the signal band to the carrier frequency is small even when the bandwidth of the received signals is wide. Hence, group delay differences are small in the signal band. Accordingly, the phase shifters 61 to 64 can each easily implement desired phase control for the entirety of the signal band.

In the example depicted in FIG. 11B, the phase control circuit 6 also includes mixers 71 to 74 and phase shifters 61 to 64. However, in the configuration depicted in FIG. 11B, the phase shifters 61 to 64 are provided on the output sides of the mixers 71 to 74. In this case, the phases of received signals are controlled in the baseband region or the intermediate frequency band. In the example depicted in FIG. 11B, a received signal is down-converted by the mixers 71 to 74 after being separated. However, the received signal may be down-converted by one mixer. In this case, the down-converted received signal is guided to the phase shifters 61 to 64.

The configuration depicted in FIG. 11C corresponds to the configuration illustrated in FIG. 5. In particular, the phase control circuit 6 includes a phase shifter 65 in addition to the phase shifters 61 to 64 and the mixers 71 to 74 and performs phase control in two stages. The phase shifters 61 to 64 are provided on the input sides of the mixers 71 to 74 in the example depicted in FIG. 11C but may be provided on the output sides of the mixers 71 to 74.

The phase shifter 65 adjusts the directions of transmission beams formed by the phase shifters 61 to 64. As in the configuration depicted in FIG. 5, the phase shifters 61 to 64 control the phase of a received signal with a coarse phase control step, and the phase shifter 65 controls the phase of a signal with a fine phase control step than the phase shifters 61 to 64. In this case, the phase shifter 65 does not need to perform phase control within a range from 0° to 360°. For example, the phase shifter 65 may attain a desired phase within the range of 0 to "360/M" degrees when the phase control step of each of the phase shifters 61 to 64 is "360/M" degrees. When the phase control step of each of the phase shifters 61 to 64 is "360/2M" degrees, the phase shifter 65 may attain a desired phase within the range of 0 to "360/2M" degrees.

In the examples depicted in FIGS. 11A and 11B, the phase of a received signal is controlled by the phase shifters 61 to 64. By contrast, in the example depicted in FIG. 12A, the phases of local signals to be used for down-conversion are controlled. In particular, the phase shifters 81 to 84 each control the phase of a local signal in accordance with a weight W assigned by the controller 4. The mixers 71 to 74 respectively multiply received signals by the output signals of the phase shifters 81 to 84.

In the configuration depicted in FIG. 12B, phase control of each received signal is implemented by a plurality of phase shifters. In this example, the phase of a signal received from the terminal 101 is controlled by a phase shifter 66a provided on the input side of the mixer 71, a phase shifter 66b provided on the output side of the mixer 71, and a phase shifter 66c that controls the phase of a local signal. Similarly, the phase of a received signal from another terminal is also controlled by three phase shifters.

The configuration depicted in FIG. 13A corresponds to the configuration illustrated in FIG. 8. Thus, the phase control circuit 6 implemented in the receiver circuit includes phase shifter units 91 to 94. Each of the phase shifter units (in this example, the phase shifter unit 91) includes variable amplifiers 91a and 91b and mixers 91c and 91d. The variable amplifiers 91a and 91b each control the amplitude of a received signal in accordance with a phase control signal from the controller 4. The mixer 91c is supplied with an LO (0) signal or an LO (180) signal selected by the controller 4. The mixer 91d is supplied with an LO (90) signal or an LO (270) signal selected by the controller 4. The mixers 91c and 91d respectively down-convert output signals of the variable amplifiers 91a and 91b by using a local signal supplied to the mixers.

As in the configuration depicted in FIG. 13A, each of the phase shifter units (in this example, phase shifter unit 91) in the phase control circuit 6 depicted in FIG. 13B includes variable amplifiers 91a and 91b and mixers 91c and 91d. However, in the configuration depicted in FIG. 13B, the variable amplifiers 91a and 91b are provided on the output sides of the mixers 91c and 91d. Thus, the variable amplifiers 91a and 91b respectively control the amplitudes of received signals down-converted by the mixers 91c and 91d. In this way, in the configuration depicted in FIG. 13B, the amplitude of a received signal down-converted into a signal in a low frequency band (in this example, the baseband region or the intermediate frequency band) is controlled. Thus, the accuracy in amplitude control will be increased, and the accuracy in phase control of received signals will be increased, thereby increasing the accuracy in the control of direction of reception beams. Therefore, the communication quality will be enhanced.

In the configurations depicted in FIGS. 13A and 13B in which reception beams are formed, the amplitude of the output signal of the phase control circuit 6 can be varied by varying the gains of the variable amplifiers 91a and 91b with the ratio between the gains of the variable amplifiers 91a and 91b fixed, as in the configuration in which transmission beams are formed. According to this configuration, "amplitude control" can be performed. Combining the "amplitude control" with the above-described phase settings ("phase control") allows the phase control circuit 6 to implement "phase control" and "amplitude control".

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A beam forming device comprising:
N control circuits, N being an integer larger than one; and
N antenna elements, wherein
each of M signals in a first frequency range is distributed to the N control circuits, M being an integer larger than one,
each of the N control circuits controls at least either a phase or an amplitude of each of the M signals,
each of the N control circuits generates a transmission signal in a second frequency range from the M signals, at least either the phase or the amplitude of each of the M signals having been controlled,
each of the N antenna elements outputs the transmission signal generated by corresponding control circuit, and
the second frequency range is higher than the first frequency range.

2. The beam forming device according to claim 1, wherein
each of the N control circuits includes
a plurality of mixers that respectively up-convert the M signals, and
a plurality of phase shifters that respectively control phases of output signals of the plurality of mixers, and
each of the N control circuits generates the transmission signal by combining output signals of the plurality of phase shifters.

3. The beam forming device according to claim 1, wherein
each of the N control circuits includes
a plurality of phase shifters that respectively control phases of the M signals, and
a plurality of mixers that respectively up-convert output signals of the plurality of phase shifters, and
each of the N control circuits generates the transmission signal by combining output signals of the plurality of mixers.

4. The beam forming device according to claim 1, wherein
each of the N control circuits includes
a plurality of mixers that respectively multiply the M signals by oscillation signals, and
a plurality of phase shifters that respectively control phases of the oscillation signals, and
each of the control circuits generates the transmission signal by combining output signals of the plurality of mixers.

5. The beam forming device according to claim 1, wherein
each of the N control circuits includes
a plurality of first phase shifters that respectively control phases of the M signals or phases of the M signals up-converted in the control circuit, and
a second phase shifter that controls a phase of a signal obtained by combining output signals of the plurality of first phase shifters to generate the transmission signal.

6. The beam forming device according to claim 5, wherein
a phase control step of each of the first phase shifters is 360/(L×M) degrees, where M is a number of transmission beams that the beam forming device is capable of forming concurrently, and L is an arbitrary integer.

7. The beam forming device according to claim 6, wherein
a range of phase control performed by the second phase shifter is 360/(L×M) degrees.

8. The beam forming device according to claim 1, wherein
each of the N control circuits includes a plurality of phase shifter units,
each of the phase shifter units includes
a pair of mixers that generate two up-converted signals having phases different from each other from a corresponding input signal among the M signals, and
a pair of variable amplifiers that respectively control amplitudes of the two up-converted signals output from the pair of mixers,
each of the phase shifter units combines output signals of the pair of variable amplifiers, and
each of the N control circuits combines output signals of the plurality of phase shifter units to generate the transmission signal.

9. The beam forming device according to claim 1, wherein
each of the N control circuits includes a plurality of phase shifter units,
each of the phase shifter units includes
a pair of variable amplifiers that generate two amplified signals from a corresponding input signal among the M signals, and
a pair of mixers that respectively up-convert the two amplified signals output from the pair of variable amplifiers and make phases of the two amplified signals different from each other,
each of the phase shifter units combines output signals of the pair of mixers, and
each of the N control circuits combines output signals of the plurality of phase shifter units to generate the transmission signal.

10. A beam forming device comprising:
N antenna elements, N being an integer larger than one; and
N control circuits, wherein
each of the N antenna elements receives a signal in a first frequency range,
each of the N control circuits branches a received signal received by corresponding antenna element into M received signals and controls at least either a phase or an amplitude of each of the M received signals to generate M controlled signals in a second frequency range, M being an integer larger than one, and
the first frequency range is higher than the second frequency range.

11. The beam forming device according to claim 10, wherein
each of the N control circuits includes
a plurality of mixers that respectively down-convert the M received signals, and
a plurality of phase shifters that respectively control phases of output signals of the plurality of mixers to generate the M controlled signals.

12. The beam forming device according to claim 10, wherein
each of the N control circuits includes
a plurality of phase shifters that respectively control phases of the M received signals, and
a plurality of mixers that respectively down-convert output signals of the plurality of phase shifters to generate the M controlled signals.

13. The beam forming device according to claim 10, wherein
each of the N control circuits includes
a plurality of mixers that respectively multiply the M received signals by oscillation signals to generate the M controlled signals, and a plurality of phase shifters that respectively control phases of the oscillation signals.

14. The beam forming device according to claim 10, wherein
each of the N control circuits includes
a first phase shifter that controls a phase of the received signal, an output signal of the first phase shifter being branched into M signals,
a plurality of second phase shifters that respectively control phases of the M signals, and
a plurality of mixers that respectively down-convert output signals of the plurality of phase shifters to generate the M controlled signals.

15. The beam forming device according to claim 14, wherein
a phase control step of each of the second phase shifters is 360/(L×M) degrees, where M is a number of reception beams that the beam forming device is capable of forming concurrently, and L is an arbitrary integer.

16. The beam forming device according to claim 15, wherein
a range of phase control performed by the first phase shifter is 360/(L×M) degrees.

17. The beam forming device according to claim 10, wherein
each of the N control circuits includes a plurality of phase shifter units,
each of the phase shifter units includes
a pair of mixers that generate two down-converted signals having phases different from each other from the received signal, and
a pair of variable amplifiers that respectively control amplitudes of the two down-converted signals output from the pair of mixers, and
each of the phase shifter units combines output signals of the pair of variable amplifiers and outputs a result.

18. The beam forming device according to claim 10, wherein
each of the N control circuits includes a plurality of phase shifter units,
each of the phase shifter units includes
a pair of variable amplifiers that generate two amplified signals from the received signal, and
a pair of mixers that respectively down-convert the two amplified signals output from the pair of variable amplifiers and make phases of the two amplified signals different from each other, and
each of the phase shifter units combines output signals of the pair of mixers and outputs a result.

19. A beam forming method for forming transmission beams by using a beam forming device that includes M digital-to-analog converters, N phase control circuits, and N antenna elements, wherein
M signals in a first frequency range output from the M digital-to-analog converters are respectively distributed to the N phase control circuits,
each of the N phase control circuits performs, for each of the M signals input to the phase control circuit from the M digital-to-analog converters, phase control and up-conversion from the first frequency range to a second frequency range, and
the M signals for which each of the phase control circuits has performed the phase control and the up-conversion are combined and output via a corresponding antenna element.

20. A beam forming method for forming reception beams by using a beam forming device that includes N antenna elements, N phase control circuits, and M analog-to-digital converters, wherein
each of the phase control circuits divides a signal in a first frequency range received via a corresponding antenna element into M received signals and performs, for each of the M received signals, phase control and down-conversion from the first frequency range to a second frequency range, and
the M received signals for which each of the phase control circuits has performed the phase control and the down-conversion are respectively guided to ach of the M analog-to-digital converters.

* * * * *